(12) United States Patent
Funato et al.

(10) Patent No.: US 7,595,650 B2
(45) Date of Patent: Sep. 29, 2009

(54) MAGNETIC FIELD PROBE APPARATUS AND A METHOD FOR MEASURING MAGNETIC FIELD

(75) Inventors: Hiroki Funato, Hitachinaka (JP); Takashi Suga, Yokohama (JP); Kouichi Uesaka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 53 days.

(21) Appl. No.: 11/622,009

(22) Filed: Jan. 11, 2007

(65) Prior Publication Data

US 2007/0177414 A1     Aug. 2, 2007

(30) Foreign Application Priority Data

Jan. 13, 2006    (JP)  ............................ 2006-005483

(51) Int. Cl.
    *G01R 33/00*     (2006.01)
    *G01R 31/02*     (2006.01)

(52) U.S. Cl. ........................ 324/754; 324/260

(58) Field of Classification Search ....................... None
See application file for complete search history.

(56) References Cited

U.S. PATENT DOCUMENTS

| | | | | |
|---|---|---|---|---|
| 4,213,086 A | * | 7/1980 | Iida et al. ..................... | 324/765 |
| 4,823,081 A | * | 4/1989 | Geisler ....................... | 324/225 |
| 5,300,879 A | * | 4/1994 | Masuda et al. ................. | 324/95 |
| 6,281,697 B1 | * | 8/2001 | Masuda et al. ............... | 324/765 |
| 6,856,131 B2 | * | 2/2005 | Miyazawa et al. ........... | 324/252 |
| 7,315,173 B2 | * | 1/2008 | Funato et al. ................ | 324/632 |
| 7,362,098 B2 | * | 4/2008 | Ando et al. .................. | 324/258 |

FOREIGN PATENT DOCUMENTS

| | | |
|---|---|---|
| JP | 2002-156430 | 5/2002 |
| JP | 2003-279611 | 10/2003 |

\* cited by examiner

*Primary Examiner*—Vinh P Nguyen
(74) *Attorney, Agent, or Firm*—Antonelli, Terry, Stout & Kraus, LLP.

(57) ABSTRACT

A magnetic field probe apparatus includes a loop-like conductor and feeder lines spaced at a distance from the loop-like conductor. The shape of the loop-like conductor and the arrangement of the feeder lines are adjusted in such a manner that the resonance frequency determined by the combination of the inductance of the loop-like conductor line and the capacitance formed between the looped-conductor and the feeder lines, is matched to the frequency of the magnetic field generated by and in the vicinity of a measurement object (e.g. electronic device) or the frequency of the electric signal which generates the magnetic field. With the magnetic field probe apparatus according to this invention, the magnetic field in the vicinity of the measurement object can be measured with high sensitivity.

7 Claims, 7 Drawing Sheets

MAGNETIC FIELD PROBE APPARATUS AND A METHOD FOR MEASURING MAGNETIC FIELD

INCORPORATION BY REFERENCE

The present application claims priority from Japanese application JP2006-005483 filed on Jan. 13, 2006, the content of which is hereby incorporated by reference into this application.

BACKGROUND OF THE INVENTION

This invention relates to an apparatus and a method for measuring the spatial distribution of the intensity, phase and orientation of the magnetic field generated in or around an electronic device.

The technique of measuring the spatial distribution of magnetic field in the vicinity of an electronic device is useful in locating the source of the current attributable to unwanted electromagnetic radiations (known as electromagnetic interference) or the cause of electromagnetic interference attributable to mutual interference between different electronic devices that gives rise to erroneous operations or degraded performances of the electronic devices.

The inventors of this invention have already developed such magnetic field probes, methods and apparatuses for measuring magnetic fields generated by electric and electronic devices as disclosed in the patent documents, JP-A-2002-156430 and JP-A-2003-279611, and also have made patent applications related to the probes, the measuring methods and the measuring apparatuses. Particularly, JP-A-2002-156430 relates to magnetic field probes and JP-A-2003-279611 to methods and apparatuses for measuring magnetic fields.

In general, the intensity and phase of the magnetic field in the vicinity of a measurement object are measured by using a probe element wherein the open ends of a loop-like conductor whose size is large enough to have a desired measurement resolution are connected respectively with the one end (hereafter referred to as a signal conductor) and the other end (hereafter referred to for simplicity as a ground conductor) of a pair of feeder lines. The loop-like conductor mentioned above and ones to be mentioned hereafter mean not only a circular conductor but also any one of polygonal conductors. Further, the open ends of the loop-like conductor are separated from each other. The feeder lines consist of a signal conductor and a ground (GND) conductor which are electrically connected with each other via a resistor (hereafter referred to also as a terminal resistor). The GND conductor need not be necessarily kept at the earth potential in a narrow sense, but may be electrically coupled to the reference potential of a magnetic field measuring apparatus.

When a loop-shaped conductor having such a structure as described above is placed in the vicinity of a measurement object, the magnetic field present in the vicinity of the measurement object induces a current in the loop-like conductor and a voltage is developed across the terminal resistor that terminates the feeder lines. The intensity and phase of the magnetic field in the vicinity of the loop-like conductor can be detected by measuring the magnitude and phase of the voltage developed across the terminal resistor.

SUMMARY OF THE INVENTION

In general, in the actual use of a magnetic field probe with a loop antenna (i.e. such a loop-like conductor as described above), the greater are the dimensions, i.e. loop size, the higher is the induced voltage for magnetic field of the same intensity. Or conversely, the smaller is the loop size, the lower is the induced voltage. Therefore, if a system as a measurement object has a fixed noise level, the larger loop size will provide the higher S/N ratio, that is, secure a measurement of magnetic field with high sensitivity. However, the increase in the loop size of the antenna causes the decrease in the spatial resolution in measurement. The size of the loop antenna must therefore be restricted to a range within which the antenna can obtain a desired resolution. Also, with a large loop antenna, the conductor forming the loop becomes long so that the associated inductance is also large. Accordingly, the higher is the frequency of the magnetic field to be measured or that of the electric signal generating the magnetic field, the higher is the inductance of the loop-like conductor. As a result, the voltage drop throughout the loop-like conductor becomes larger so that the voltage developed across the terminal resistor terminating the feeder lines becomes lower. This may cause a problem that the sensitivity to magnetic field of the measuring system as a whole degrades. One idea to avoid this problem is to make the resistance of the terminal resistor large. In general, however, the terminal resistor for the high frequency measurement instruments will have a resistance of 50 Ω, and if the terminal resistor has a resistance larger than 50 Ω, such a mechanism as an impedance converter must be inserted to avoid impedance mismatching. Thus, the measuring system incurs complexity.

This invention has been made to solve such a problem as described above. According to this invention, there is provided a magnetic field probe with high sensitivity which enables electromagnetic field to be measured with high sensitivity within a desired high frequency range by using a miniature magnetic field probe built by the conventional process of fabricating multilayer substrates or semiconductor devices and a conventional high frequency measuring apparatus.

According to this invention, one end of the loop-like conductor in which the voltage corresponding to the magnetic field to be measured is induced, is connected with the signal line side or the ground (GND) line side of a pair of feeder lines connected with a measuring device, while the other end of the loop-like conductor is not connected with the remaining feeder line but disposed in such a manner that an electric capacitance is formed between this other end and one (i.e. signal line side or GND line side) of the feeder lines. The shape of the loop-like conductor and the electric capacitance are so adjusted that the series resonance frequency specified by the capacitance and the inductance of the loop-like conductor may become equal to a predetermined measurement frequency. With this type of magnetic field probe, the impedance of the loop-like conductor can be minimized by virtue of the series resonance due to the combined effect of the inductance of the loop-like conductor and the capacitance formed between the intended end of the loop-like conductor and one of the feeder lines. As a result, the voltage drop across the loop-like conductor can be minimized. Thus, the magnetic field probe according to this invention can achieve a measurement with a higher sensitivity as compared with the conventional counterpart when measurement is performed on magnetic field having the same frequency as the series resonance frequency mentioned above.

As described above, the magnetic field probe according to this invention may be said to be a magnetic field probe capable of performing the high sensitivity measurement of magnetic field within a desired range of high frequencies.

One embodiment of the magnetic field probe according to this invention will be described as follows with reference numerals given in the attached drawings.

This magnetic field probe comprises a probe element 100 for detecting the magnetic field generated by a measurement object 101, at least a pair of transmission lines 105 connected electrically with each other via a load element 104 in which voltage or current is induced in response to the magnetic field detected by the probe element, and a control device 206 for controlling the position of the probe element with respect to the measurement object 101. The probe element 100 includes at least one conductor line (103, 103+106, 701, or 801+802) having both its ends extending in the direction opposite to that direction in which the probe element 100 approaches the measurement object 101 under the control of the control device 206 for measurement. At least one end of the conductor line (103, 103+106, 701, or 801+802) is disposed opposite to and separated at a distance from, one of the transmission lines 105 in an area remote from the measurement object 101 so that electric capacitance 107 may be formed between the one end of the conductor line (103, 103+106, 701, or 801+802) and the one of the transmission lines 105.

In a method of measuring magnetic field according to this invention, the detecting portion of the probe element 100 is positioned in the vicinity of the measurement object 101 and the spatial distribution of the intensity and orientation of the magnetic field generated by the measurement object 101 is determined on the basis of the voltage or current induced in the probe element 100 due to the magnetic field surrounding the probe element 100. In this method of measurement, a series resonance circuit consisting of at least an inductance L and at least a capacitance C is composed of at least one of the conductor lines (103, 701, or 801+801) included in the probe element 100, and the pair of feeder lines 105 connected with each other via the load element 104 across which the voltage is developed or in which the current is induced. In order for the voltage developed across or the current induced in, the load element 104 to take a maximum value at the specific frequency of the magnetic field generated by the measurement object 101, the inductance of the one of the conductor lines (103, 701, or 801+801) and the capacitance formed between the one of the conductor lines (103, 701, or 801+801) and at least one of the pair of feeder lines 105 are adjusted respectively.

These and other objects, features and advantages of the invention will be apparent from the following more particular description of preferred embodiments of the invention, as illustrated in the accompanying drawings.

DESCRIPTION OF THE EMBODIMENT

Embodiments of this invention will now be described with reference to the attached drawings in the following.

Figure 1:
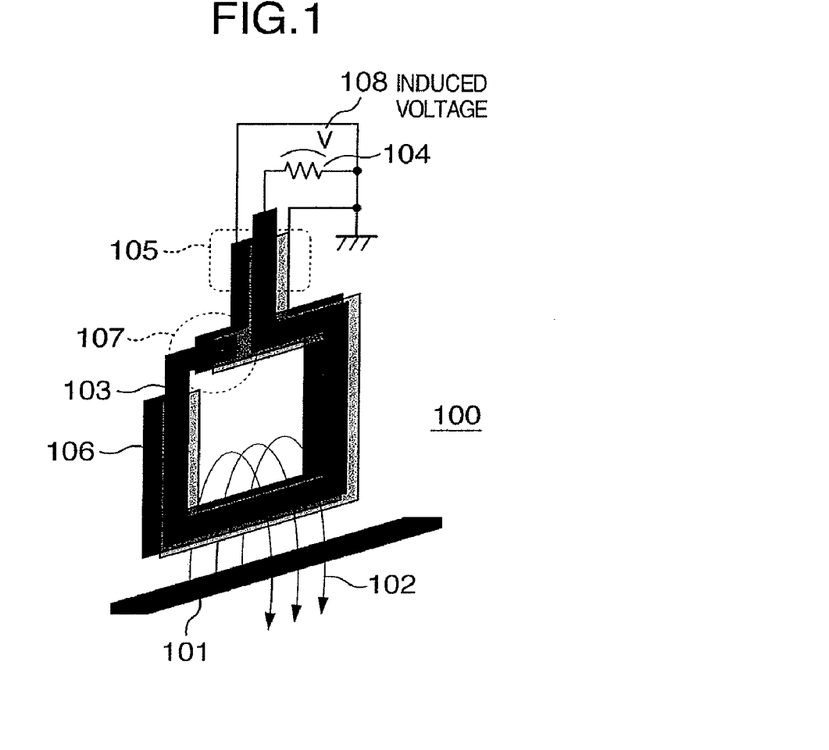
FIG. 1 shows a first structure of a magnetic field probe according to this invention.

FIG. 1 shows a model structure of a magnetic field probe as an embodiment of this invention, for measuring the intensity, phase and orientation of the magnetic field 102 developed by such a measurement object 101 as the housing of an electronic device, a printed circuit board (PCB), a large-scale integrated (LSI) circuit or wiring conductors.

Figure 2:
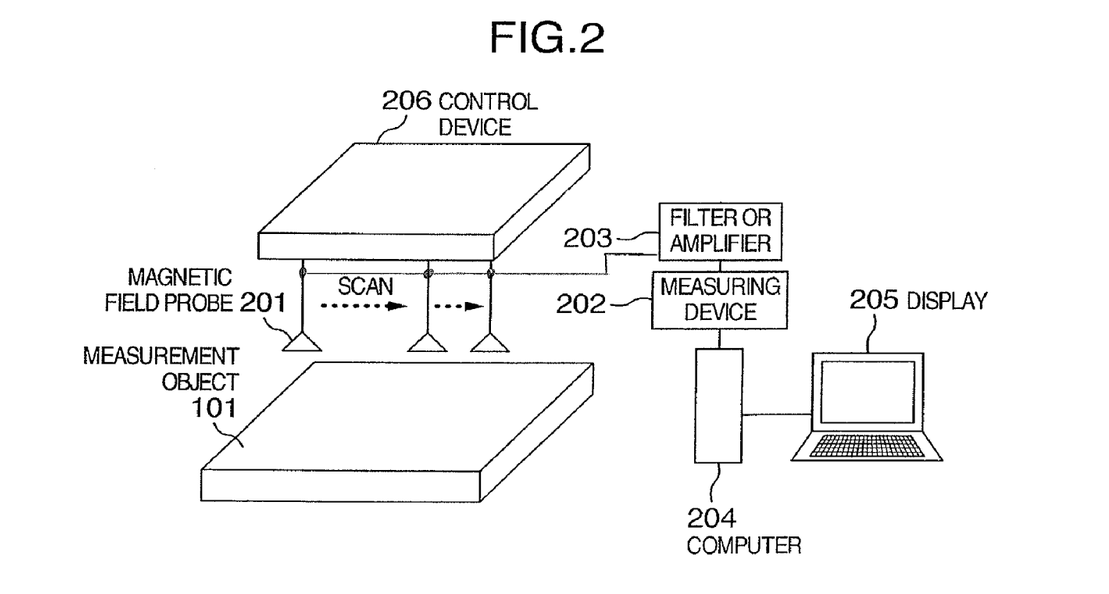
FIG. 2 is a general view of a measuring apparatus according to this invention.

FIG. 2 schematically shows a model structure of a measuring apparatus for locating the radiation source of electromagnetic energy in or around a measuring object 101 through the measurement of the spatial distribution of the intensity, phase and orientation of the magnetic field 102 generated by the measurement object 101 by using a magnetic field probe.

The measuring apparatus as shown in FIG. 2 may have different names such as a magnetic field probe apparatus, a magnetic field measuring apparatus, a magnetic field tester, etc. depending on what it is used for (i.e. the sort of measurement object and the physical quantities obtained therefrom).

As shown in FIG. 2, this measuring apparatus comprises a magnetic field probe 201 (such as a probe element as shown in FIG. 1) for detecting the magnetic field 102 generated by a measurement object 101; a measuring device 202 for measuring the signal from the magnetic field probe 201; an amplifier or filter 203 for amplifying the signal from the magnetic field probe 201 to a required level of intensity, or extracting only a required component of frequency; a computer 204 including a CPU (Central Processing Unit) for calculating the intensity and phase of the magnetic field in or in the vicinity of the measurement object 101 on the basis of the values of the voltage and current obtained from the measuring device 202, memories, and a memory device for storing programs which are used to calculate the intensity and phase of the magnetic field 102; a display 205 for displaying the result of measurement; and a control device for controlling the position of the magnetic field probe 201.

It is to be noted here that there must be a certain distance between the magnetic field probe 201 and the measuring apparatus incorporating therein the filter or amplifier 203 so as to prevent the spatial distribution of the magnetic field in the vicinity of the measurement object 101 from being disturbed. If the distance r between the measurement object 101 and the magnetic field probe 201 is such that $r \leq \lambda/(2\pi)$, then they are said to be in the electromagnetic vicinity of each other. Here, $\lambda$ denotes the wavelength of the electromagnetic waves generated by the measurement object 101.

Description will now be made of how magnetic field is measured by using the magnetic field probe 201.

In measuring the magnetic field 102 in the vicinity of the measurement object 101 such as an electronic device, a PCB, an LSI circuit or wiring conductors, the magnetic field probe 201 changes its position while being controlled by the control device 206; the voltage induced across the probe 201 due to the magnetic field 102 (or part thereof) interacting thereon is fed to the filter/amplifier 203 to extract a desired signal component having a frequency f (or a frequency band including a frequency f) or to be amplified to a voltage signal having a desired intensity; and the thus processed output of the filter/amplifier 203 is applied to the measuring device 202. The filter used here is not limited to a band-pass filter, but may be a combination of a variable high-pass filter and a variable low-pass filter so that the frequency to be measured can be arbitrarily selected. During the operation of measuring the magnetic field 102 in the vicinity of the measurement object 101, the position of measurement (e.g. the position of the magnetic field probe 201 relative to the measurement object 101) and the result of magnetic field measurement are stored in the memory device of the computer 204. During this measurement operation, the control device 206 must control the position of the magnetic field probe 201 at a precision higher than the required resolution when the probe 201 scans over the surface of the measurement object 101.

Description will now be given to the structure of the magnetic field probe 201.

As shown in FIG. 1, the magnetic field probe 201 (the probe element 100) comprises a signal line 103 made of conductor in the form of a loop, and feeder lines 105 with which the signal line 103 is connected via load resistor 104 provided in the measuring device 202. In the description of the embodiments of this invention, the term "loop" does not necessarily mean a circular form alone, but may include any polygonal shape (e.g. a rectangle). Further, the loop of the conductive material need not close itself, that is, the loop may be cut at a point and there may be a gap between the cut ends. In other words, the term "loop" or equivalent term used hereinafter throughout this specification will not indicate a closed curve, unless mentioned otherwise.

The geometry of the feeder line 105 is not particularly specified: it may be in the form of microstrip line, strip line, simple line, or coplanar line. In any case, however, it is necessary to match the impedance of the feeder line 105 with the load resistor 104 provided in the measuring device 202 (see FIG. 2) so as to avoid the reflection of signal at the point of connection with the measuring device 202. The feeder lines 105 are built with at least a pair of conductors connected with each other via a load element such as the load resistor 104. A potential difference may be developed across this pair of conductors due to the magnetic field applied to or detected by, the magnetic field probe 201. Therefore, for convenience' sake, one of the pair of the conductors is referred to as a signal conductor and the other as a ground conductor. However, it is not necessary that the ground (GND) conductor should be kept at the earth potential in a narrow sense. For example, it may be maintained at the reference voltage used in the measuring device or at a floating voltage having a certain potential difference with respect to the earth voltage. Further, in the description that follows, it is not necessary to specify one particular conductor of the feeder lines 105 as a signal line and the other as a GND line. The roles of the pair conductors are exchangeable depending on the embodiments of this invention.

On the other hand, as shown in FIG. 1, the loop conductors, which serve as the main part of the probe element 100 and therefore are placed in the magnetic field to be measured, comprise a signal line 103 and a pair of GND lines 106 disposed in a manner that the signal line 103 is sandwiched between the GND lines 106. The relationship between the signal line 103 and the GND lines 106, which constitute the loop conductors, is the same as that between the signal line and the GND line described and defined above in reference to the feeder lines 105. The loop conductors of the loop element 100 shown in FIG. 1 basically consist of at least one signal line 103 and one GND line 106. As described later with other embodiments of this invention, however, the loop conductors may be constructed as signal lines 103 alone or GND lines 106 alone. The probe element 100, as shown in FIG. 1, has one of its loop conductors 103 and 106 disposed in close contact on one main surface of a dielectric substrate (plate or film) and the other loop conductor disposed in close contact on the other main surface of the dielectric substrate, thereby taking a microstrip configuration. However, the shape of the loop conductors and the structure of the probe element are not limited to those shown in the attached drawings. Further, although any conductive material can be used for the signal line 103 and the GND line 106, copper or gold, which has a high electric conductivity, should preferably be used so as to have as small a resistance as possible.

The material for the interlayer film or plate (dielectric or insulating material) separating one of the loop conductors 103 and 105 from the other is not limited to a particular substance, either, but a glass-epoxy resin substrate, a silicon substrate or a ceramic substrate should preferably be used for the purpose so as to minimize the loss, e.g. the attenuation of the intensity of the detected magnetic field, due to the stray conductance with respect to the loop conductors. Both the loop section (at least one of the loop conductors 103 and 106) and the feeder lines 105 may be formed on the same substrate, or the chip on which the loop section is formed may be electrically connected with the substrate on which the feeder lines 105 are formed. According to this invention, the signal line 103 and the GND line 106 are not connected, as indicated at reference numeral 107, with each other so that capacitance C is provided there. Since the geometrical shapes of the end portions of the feeder lines 105 and the loop conductors 103 and 105 opposite to them serve to define the capacitance C, the capacitance C may be adjusted by partially deforming the end portions or by providing at least one of them with a microstrip pattern.

Figure 12A:
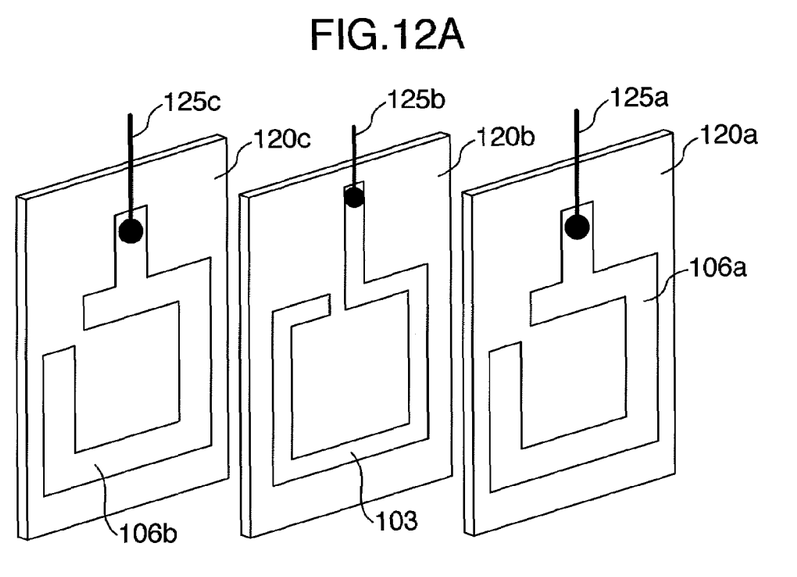
FIGS. 12A through 12D show the detailed structure and a simplified model, of a magnetic field probe (probe element) according to this invention.
Figure 12B:
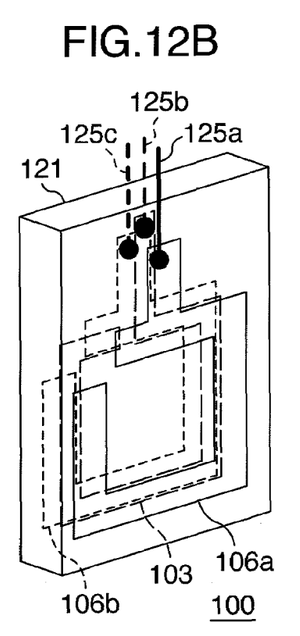

FIGS. 12A and 12B show a concrete example of the probe element 100 having a microstrip configuration as shown in FIG. 1. As shown in FIG. 12A, a loop-like signal line 103 and loop-like GND lines 106 are formed on the main surfaces of the three substrates 120a, 120b and 120c made of the material described above as the interlayer film or plate. The actual formation of the loop-like lines uses such techniques as screen printing, patterning by photolithography, or adhesion of conductive film. Lead wires 125a, 125b and 125c are provided on the main surfaces of the substrates 120a, 120b and 120c, and connected electrically with the loop-like conductor lines 103 and 106 (via feeder lines 105). The free ends of the lead wires extend beyond the edges of the substrates. These substrates 120a, 120b and 120c are stuck together by using suitable resin or by the application of pressure. Consequently, the completed chip of a probe element 100 is as shown in FIG. 12B. FIG. 12B shows a sealing member 121 consisting of the laminated substrates 120a, 120b and 120c, and a protective film formed on the main surface of the substrate 120a to cover the GND line 106a. The free end of the lead wire 125b is connected with one of the electrodes of the load element 104 (see FIG. 1) while the free ends of the lead wires 125a and 125c are connected with the other electrode of the load element 104. Thus, those portions of the lead wires 125a, 125b and 125c may serve as parts of feeder lines. The potentials at the lead wires 125a and 125c are stabilized, relative to the potential at the lead wire 125b, by, for example, being maintained at the reference voltage used in the measurement apparatus having the probe element 100.

Since the substrates 120a and 120b are made of dielectric or insulating material, as described above, the signal line 103 along with the substrate 120a and a first GND line 106a forms a first microstrip circuit while the signal line 103 along with the substrate 120b and a second GND line 106b forms a second microstrip circuit. The first and the second microstrip circuits are in a back-to-back configuration. Capacitances are formed between the signal line 103 and the first GND line 106 and between the signal line 103 and the second GND line 106b. The values of the capacitances can be adjusted by modifying the discontinuity sections in the loop-like conductors 103 and 106. The discontinuity section is formed by opening the loop conductor at a point and spacing one open end (a first portion) from the other (a second portion). This definition of the discontinuity section can be applied to the signal line 103 and the GND lines 106 as well. The continuous section (a third portion) of the conductor loop between the open ends is situated nearer to the measurement object 101 than the first and second portions in actual measurement. Although the signal line 103 is in the form of a loop on the substrate 120b, it does not form a closed curve. However, if a virtual line having a minimal length is introduced to bridge the discontinuity section of the loop, a virtual closed curve is resulted so that the loop area S described later will be approximated by calculating the area enclosed by the virtual closed curve.

When the magnetic field probe 201 (probe element 100) as described above is placed in the vicinity of the measurement object 101, the voltage V developed across the ends of the loop-like conductor, e.g. signal line 103, is given by the expression such that $V=2\cdot\pi\cdot f\cdot\mu\cdot S\cdot H$, where f indicates the frequency of the varying magnetic field 102 surrounding the measurement object 101, μ the permeability of the magnetic field probe, that is, that of the surface enclosed by the virtual closed curve through which the lines of force of the varying magnetic field pass, S the area of the enclosed surface, and H the intensity of the varying magnetic field at the position of the magnetic field probe 201.

When the distributed impedance of the feeder line 105 is matched to that of the cable used to connect the probe 201 with the measuring device 202, the voltage induced in the loop-like conductor 103 is shared between the distributed impedance of the loop-like conductor 103 and the load resistor 104 used in the measuring device 202. Now the magnetic field probe 201 according to this invention will be tested for its performance. When the frequency f of the magnetic field becomes equal to the resonance frequency $$fr\left(=1\bigg/(2\pi(LC)^{\frac{1}{2}})\right)$$

of the series resonance circuit constituted of the inductance L of the loop-like conductor 103 and the capacitance C defined by the discontinuity section 107, the impedance of the loop-like conductor 103 becomes extremely low so that the voltage induced in the loop-like conductor 103 hardly causes a voltage drop along the loop-like conductor 103. Consequently, almost the entire induced voltage is developed across the load resistor 104 of the measuring device 202. Therefore, even if the intensity of the magnetic field 102 to be measured is very low, the voltage signal induced in the loop-like conductor 103 by the magnetic field 102 is not buried in the noise but can be measured with high sensitivity.

In the circuit configuration as shown in FIG. 1, the voltage V developed across the resistance R1 of the load resistor 104 can be approximated by the following expression (1).

$$V = \frac{R1}{R+i\cdot 2\pi\cdot f\cdot L + \dfrac{1}{i\cdot 2\pi\cdot f\cdot C} + R1}\cdot 2\pi\cdot f\cdot\mu\cdot S\cdot H$$

where L indicates the loop inductance (the inductance of the loop-like conductor 103, C the capacitance defined by the discontinuity section 107 (the capacitance formed by the loop-like conductor 103 and the feeder line 105 electrically separated therefrom), R the loop resistance (the resistance of the loop-like conductor 103), μ the above mentioned magnetic permeability, H the intensity of the magnetic field 102, f the frequency of the magnetic field 102, and S the above mentioned area of the surface. In the derivation of the expression (1), such factors as the conductance of the discontinuity section 107, the loss in the substrates and other structural materials included in the magnetic field probe 201, the loss in the feeder lines 105, and the reflection due to the impedance mismatching are neglected.

On the other hand, the conventional magnetic field probe as disclosed in JP-A-2002-156430 etc., i.e. short-loop probe, in which the coil used for detecting magnetic field has no discontinuity that may be equivalent to the discontinuity section 107 of this invention, lacks such capacitance C. Consequently, when the open ends of the loop-like conductor are bridged by a resistor having a resistance R1, the voltage induced in the loop-like conductor and developed across the resistor can be given by the following expression (2).

$$V = \frac{R1}{R+i\cdot 2\pi\cdot f\cdot L+R1}\cdot 2\pi\cdot f\cdot\mu\cdot S\cdot H$$

Figure 3:
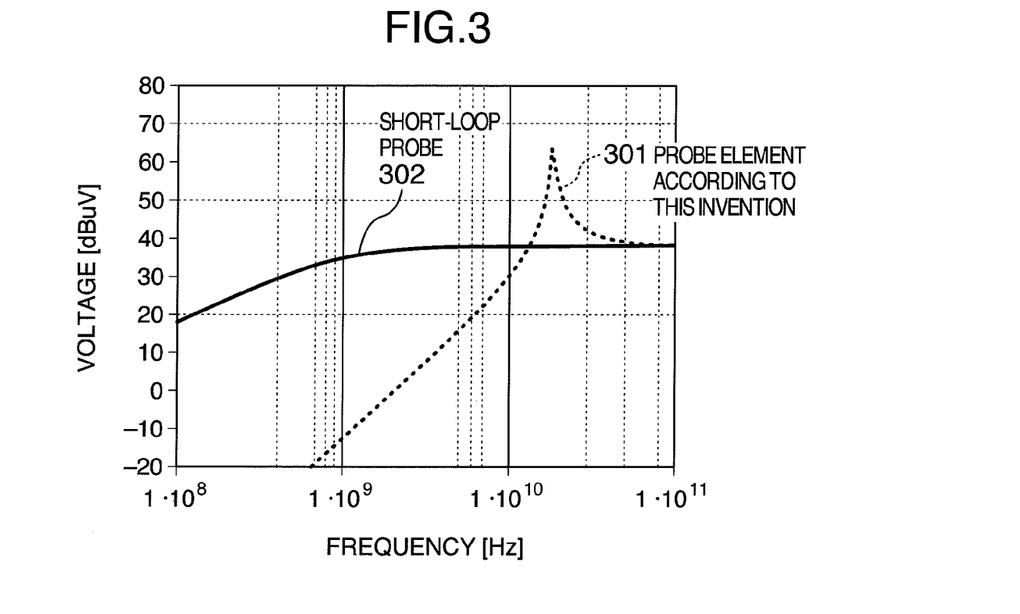
FIG. 3 graphically shows a voltage vs. frequency characteristic obtained by using the method and apparatus for measuring magnetic field according to this invention.

FIG. 3 shows the result of the theoretical analysis of the dependence on frequency of the magnetic field values (induced voltage) obtained through measurement. In this analysis, various variables are assumed to take values such that the loop inductance L =1 nH, the capacitance C at the loop end discontinuity =0.1 pF, the loop resistance R=1 Ω, the resistance R1 of the resistor 104 used in the measuring device 202 =50 Ω, the permeability $\mu=4\pi\times 10^{-7}$ H/m, the magnetic field intensity H=10 mH, and the loop area S=$10^{-6}$ m². FIG. 3 also shows the frequency characteristic 301 of the magnetic field probe 201 furnished with a loop-like conductor described above as according to this invention. Further, for the purpose of comparison with the frequency characteristic of the probe 201 of this invention, FIG. 3 also shows the frequency characteristic 302 of the short-loop probe (i.e. the conventional magnetic field probe) wherein the open ends of the loop-like conductor are connected with the signal side 103 and the GND side 106 of the feeder lines. As apparent from FIG. 3, the voltage developed across the load resistor 104 in the measuring device 202 of the magnetic field probe according to this invention is greater by about 20 dB for magnetic field in the vicinity of 20 GHz than the corresponding voltage of the conventional magnetic field probe apparatus furnished with the short-loop. This result indicates that the magnetic field probe according to this invention can obtain a greater electric signal than the conventional magnetic field probe can, for a weak magnetic field having a fixed frequency or induced by an electric signal having a fixed frequency. Accordingly, the measuring apparatus incorporating therein the magnetic field probe according to this invention can achieve the measurement of magnetic field with high sensitivity.

Since the frequency at which the magnetic field under consideration is measured with high sensitivity depends on both the inductance L of the loop conductor of the magnetic field probe and the capacitance C determined by the discontinuity section 107 of the loop conductor, then it is necessary to adjust these two parameters in order to obtain a highly sensitive measurement at a predetermined frequency. The structure for forming the capacitance C between the signal line 103 and one (106a or 106b) of the GND lines is not limited to a parallel plate structure as shown in FIG. 1, based on the multi-layer substrate with thin conductor films on the constituent layers. For example, such capacitance could be formed as fringe capacitance by using a coplanar structure as shown in FIG. 4.

Figure 4:
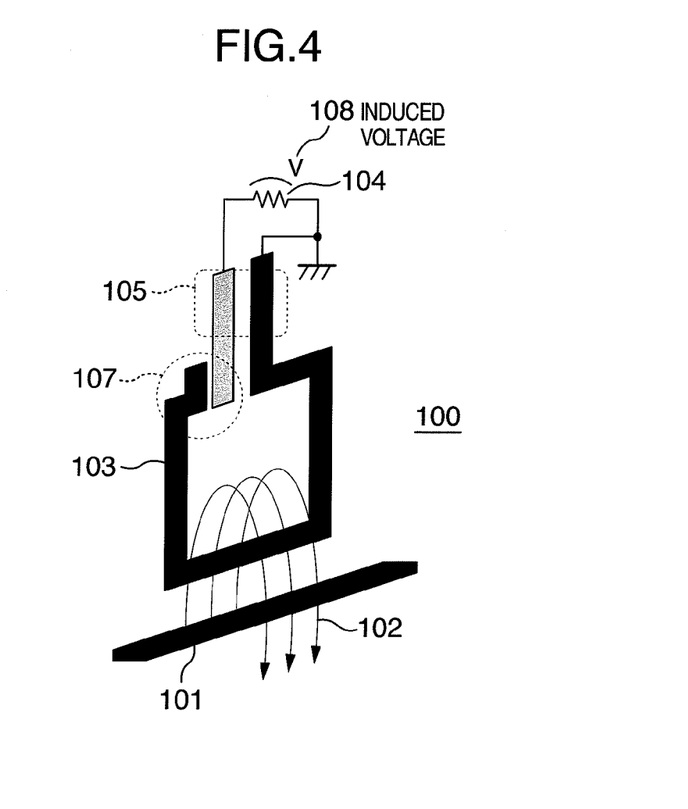
FIG. 4 shows a second structure of a magnetic field probe according to this invention.
Figure 12C:
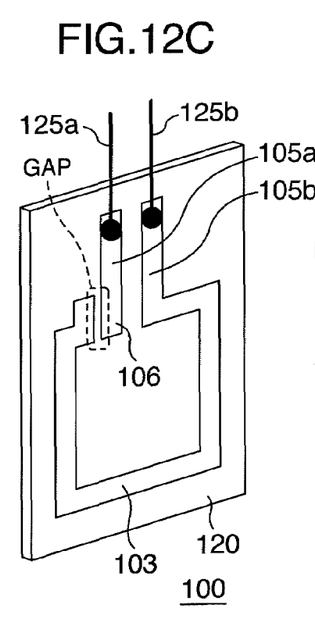

FIG. 12C shows a concrete example of the probe element 100 of coplanar structure as shown in FIG. 4. Just like the probe element 100 as shown in FIGS. 12A and 12B, a signal line 103 in the form of a loop and a GND line 106 in the form of a line segment are formed on a substrate 120 similar to the substrate as shown in FIGS. 12a and 12b, by using such a technique as screen printing, photolithographic patterning or application of adhesive conductive film. The GND line 106 is formed in integration with a GND side feeder line 105a. The loop-like signal line 103 has its one end opposed to the GND line 106 with a gap in between and the other end terminating in the signal side feeder line 105b. The gap separating the one end of the signal line 103 from the GND line 106 on the main surface of the substrate 120 serves to determine the above mentioned capacitance C. Lead wires 125a and 125b connected with the feeder lines 105a and 105b extend out of the main surface of the substrate 120 and connected electrically with each other via a load resistor 104. In this structure, the signal line 103 and the GND line 106, which have potentials different from each other under the influence of the magnetic field 102, are disposed on the main surface of the same substrate 120 to form a coplanar configuration. An insulation film may be formed on the main surface of the substrate 120 to protect the signal line 103 and the GND line 106.

Figure 12D:
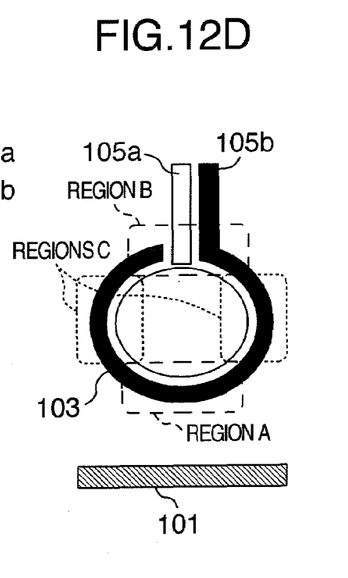

The signal line 103 and the GND lines 106 shown as loop-like conductors in FIG. 1, the signal line 103 shown as loop-like conductor in FIG. 4, and the GND line 106 shown as a line segment in FIG. 4 are summarized in a simplified model as shown in FIG. 12D. Each of these loops, represented as the signal line 103, does not make a closed curve by itself, but if the discontinuous portion is regarded as continuous, the loop defines a closed curve having the above mentioned area S. This loop-like conductor line 103 is divided into three portions depending on their functions: the region A situated near to the measurement object 101 in actual measurement, the region B positioned opposite to the region A, and the region C lying between the region A and the region B. When the lines of force of the magnetic field in the vicinity of the measurement object 101 pass through the above mentioned closed curve, a voltage or a current is induced mainly in the region A of the loop-like conductor line 103. The magnitude of the induced voltage or current is the greatest in the region A and decreases toward the region B. Actually, the components of the voltage or current induced in the regions C cancel the components induced in the region B. Accordingly, the magnitude of the magnetic field obtained through measurement by using the magnetic field probe 201 depends on the voltage or current induced in the region A, which then serves as the probe side of the probe element 100. Consideration of the effect of canceling the induced voltage or current in the regions B and C makes it apparent that the region A of the loop-like conductor line 103 should be in the form of an extended linear member. On the other hand, the above mentioned gap to adjust the capacitance should best be located in the region B where the influence of the magnetic field is negligible.

The first portions and the second portions of the loop-like conductor lines 103 and 106 described in reference to FIGS. 12A and 12B should preferably be located in the region B while the third portions of the same loop-like conductor lines 103 and 106 should be defined as those portions of the loop-like conductor lines 103 and 106 which are situated within the region A. Accordingly, the shapes of the loop-like conductor lines 103 and 106 may be such that the both ends of the third portion serving as the probe side of the probe element and defined as the region A, extend opposite to the probe side (or toward the region B) and terminate as the first and second portions in the region B. The shapes of the loop-like conductor lines 103 and 106 may also be such that they are open in the Region B to form a U-shaped configuration.

Figure 5:
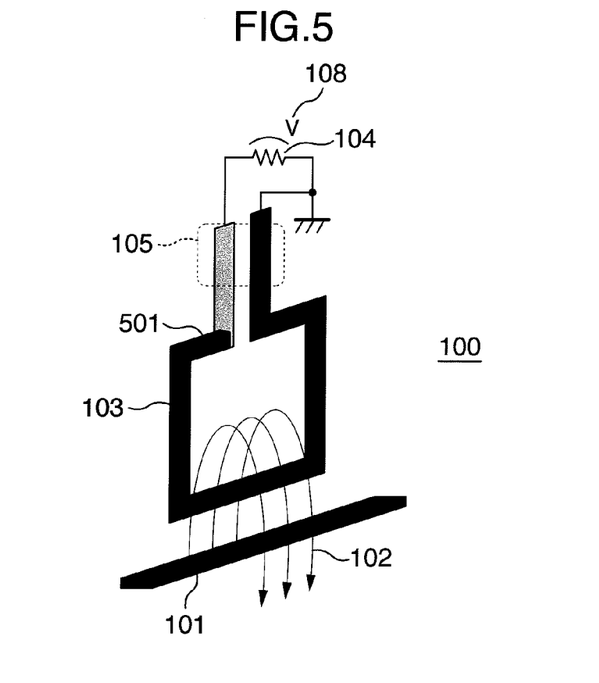
FIG. 5 shows a third structure of a magnetic field probe according to this invention.

The capacitance C in the probe element 100 having the coplanar configuration as shown in FIG. 4 depends on the distance between the loop end, i.e. one end of the signal line 103, and the GND side of the feeder line 105. Therefore, the resonance frequency of the series resonance circuit mentioned above may be made adjustable by making the distance variable. Alternatively, an electronic element 501 providing a capacitance C may be mounted between the loop end and the feeder line as shown in FIG. 5 so as to control the series resonance frequency, or the series resonance frequency may be made adjustable by making the electronic element 501 variable in capacitance. With a probe element 100 wherein the loop-like conductor line 103 and the feeder line 105 are formed on a flexible base member, the above mentioned capacitance C can be adjusted by deforming with a piezoelectric element the portion of the flexible base member serving as the discontinuity section 107.

Figure 6:
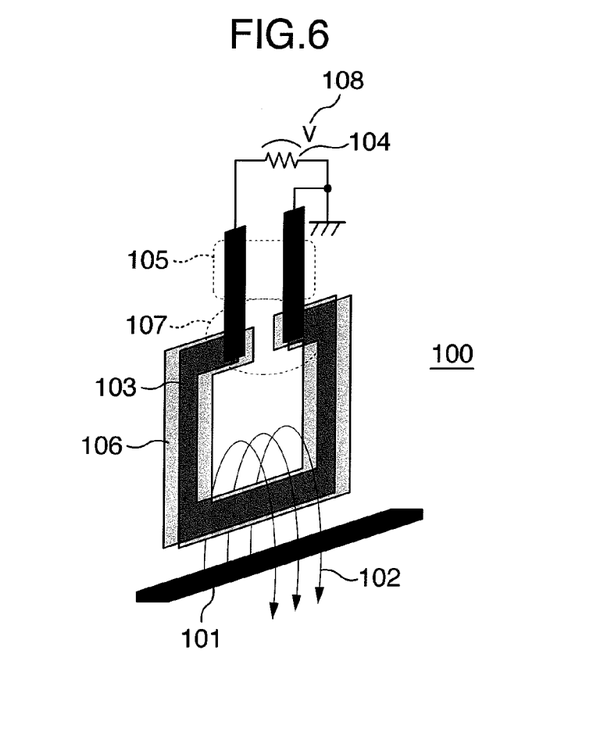
FIG. 6 shows a fourth structure of a magnetic field probe according to this invention.

The discontinuity section provided between the loop-like conductor line and the feeder line may be provided at either end of the loop-like conductor line. For example, as shown in FIG. 6, each of the loop-like conductor lines 103 and 106 has its both end open, i.e. not connected with the feeder lines, so that the series resonance frequency can be adjusted by adjusting the capacitances formed at the discontinuities. In this embodiment shown in FIG. 6, the loop-like conductor lines serving respectively as signal line 103 and the GND line 106 are formed as two separate layers, but one of them may be omitted or an additional layer as a loop-like conductor line may be added.

Figure 7:
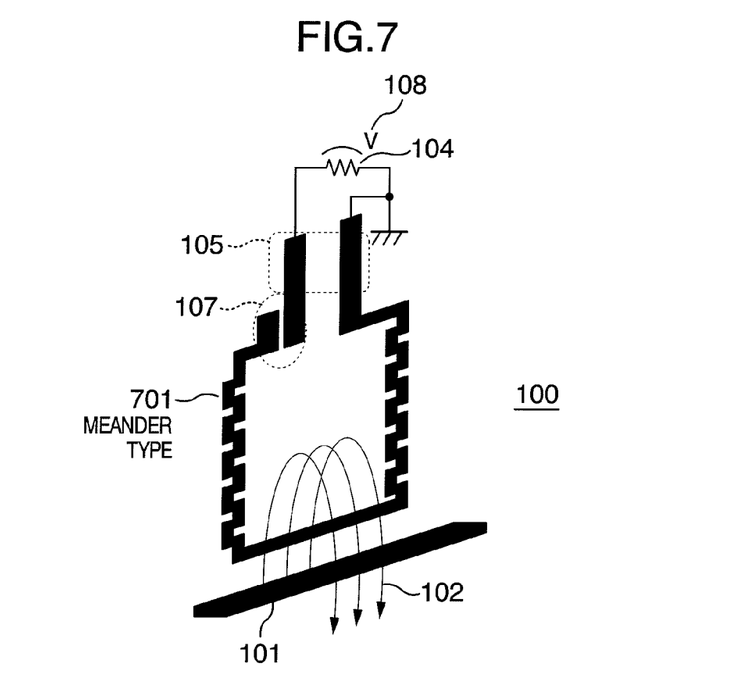
FIG. 7 shows a fifth structure of a magnetic field probe according to this invention.

Further, Since the series resonance frequency can be controlled by changing the inductance of the loop-like conductor, the series resonance frequency for the magnetic field probe can be adjusted by adjusting the loop size, the width and the thickness of the loop-like conductor line. Also, the inductance of the loop-like conductor may be adjusted by making the conductor line meander as shown in FIG. 7. Furthermore, the loop-like conductor line may be made electrically deformable by employing microelectronic mechanical systems (MEMS).

Figure 8:
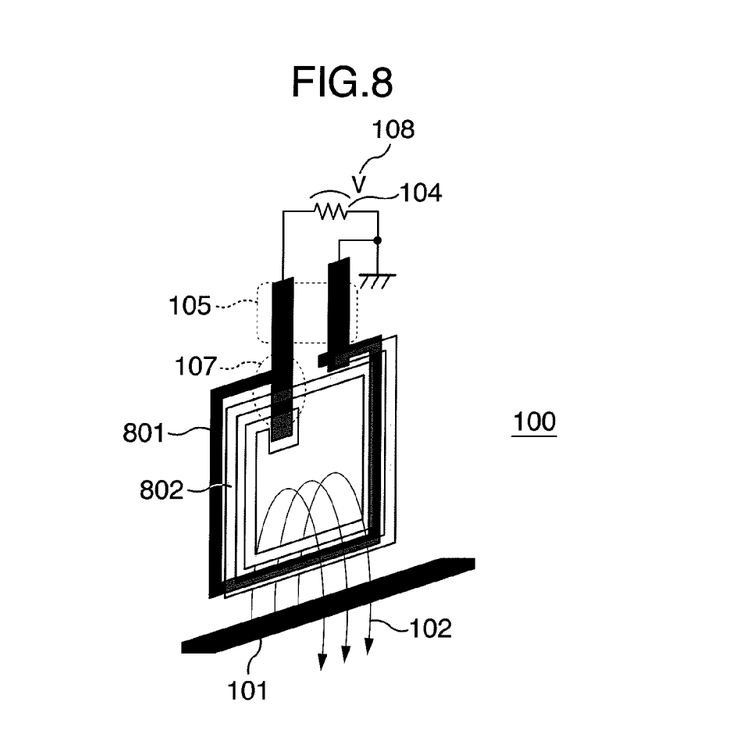
FIG. 8 shows a sixth structure of a magnetic field probe according to this invention.

FIG. 8 shows a probe element 100 as still another embodiment of this invention wherein two loop-like conductors 1 (801) and 2 (802) having different inductances are disposed on the obverse and reverse sides of a single substrate and the loop-like conductors 1 and 2 are connected in parallel with one, e.g. ground side, of the feeder lines 105. One end (or both ends) of each of the loop-like conductors 1 (801) and 2 (802) and one (or both) of the feeder lines 105 are positioned in a registered and non-contact relationship to form discontinuities which serve as capacitors that give rise to two different resonance frequencies. The loop-like conductor 1 (801) may be in the form of a rectangle one side of which has at least one discontinuity while the loop-like conductor 2 (802) may be in the form of a spiral. In the former case, the loop-like conductor will have a plurality of the third portions between the first portion (one end) and the second portion (the other end). With the embodiment shown in FIG. 8, one end of the loop-like conductor 2 (802) disposed on one main surface of the substrate is electrically connected with one of the feeder lines 105 disposed on the same main surface, and one end of the loop-like conductor 1 (801) disposed on the other main surface of the same substrate is electrically connected with the one of the feeder lines 105 via a through hole. However, just as in the embodiment shown in FIG. 6, it is also possible to electrically separate the one ends of the loop-like conductors 1 (801) and 2 (802) from the one feeder line 105. In this case, too, the other ends of the loop-like conductors 1 (801) and 2 (802) remain electrically separated from the other feeder line 105.

The embodiment shown in FIG. 8 may have several variations in one of which more than two loop-like conductors are formed in a multilayer substrate so that the completed probe element can have a plurality of resonance frequencies. If a structure is employed wherein there is no electrical connection between the loop-like conductor and the feeder line, as typically shown in FIG. 6, then even a probe element consisting of loop-like conductors in a multilayer configuration need not be provided with a through hole, thereby being able to avoid the degradation of the high frequency characteristic of the probe element 100.

Figure 9:
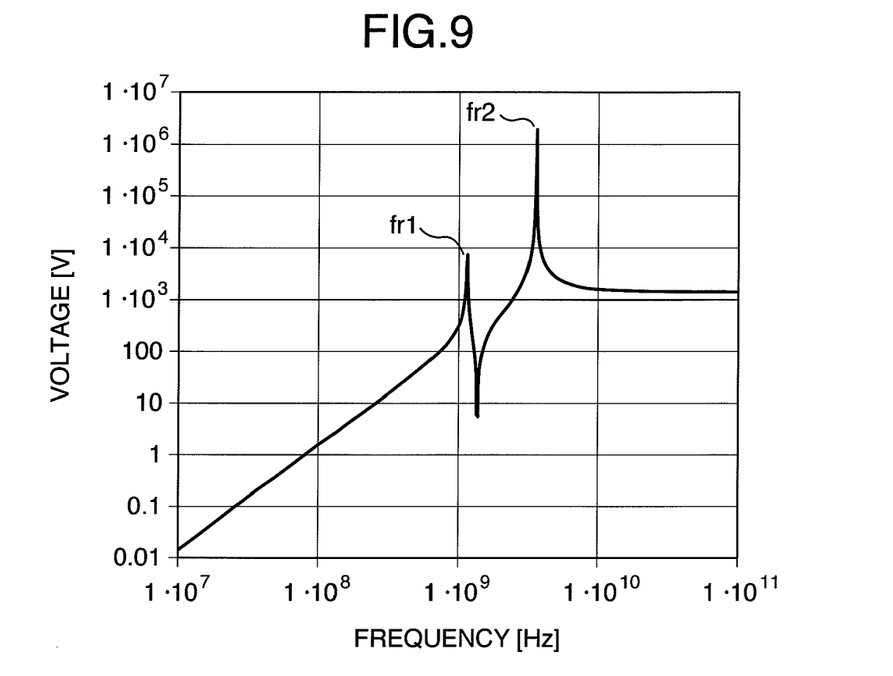
FIG. 9 graphically shows another voltage vs. frequency characteristic obtained by using the method and apparatus for measuring magnetic field according to this invention.

FIG. 9 graphically shows the result of a theoretical analysis, that is, the dependence of the magnitude of the measured magnetic field on the frequency thereof. Since the probe element 100 used in this measurement comprises two loop-like conductors having different shapes as shown in FIG. 8, two series resonance frequencies fr1 and fr2 are observed. In this analysis, it is assumed that the loop inductances $L1=20$ nH and $L2=1$ nH, the capacitances of the loop end discontinuities $C1=1$ pF and $C2=2$ pF, and the resistance of the load resistor $R1=1\ \Omega$. It is also assumed for the sake of simplicity that magnetic permeability $\mu = 4\pi \times 10^{-7}$ H/m and the magnetic field intensity $H=1$ A/m. FIG. 9 indicates that the magnetic field measurement sensitivity of the probe element 100 as shown in FIG. 8 is high also for a plurality of different frequencies.

The high sensitivity frequency band around the series resonance frequency fr (or fr1 and fr2) as shown in FIG. 3 (or FIG. 9), that is, the range of frequencies within which the induced voltage represented by the frequency characteristic curve exhibits a peak value, depends on the Q (quality factor) value of the series resonance circuit. If the resistance of the loop-like conductor increases, the Q value decreases, thereby broadening the high sensitivity frequency band width. Therefore, if it is required to perform measurements with high sensitivity over a broader range of frequency, then the resistance of the loop-like conductor must be increased to decrease the Q value for the series resonance. Alternatively, to obtain a similar effect, it is possible to cause the magnetic field probe to have a plurality of series resonance frequencies fr by using a plurality of loop-like conductors or by forming a plurality of discontinuities to serve as a plurality of capacitances C's. On the contrary, if the magnetic field frequency is previously fixed and if it is required to perform the measurement of the magnetic field with high sensitivity, then the resistance of the loop-like conductor must be as small as possible so that the Q value is made large, which increases the voltage induced at the prefixed frequency. As a result of this, the sensitivity of the magnetic field probe at a specific frequency increases remarkably and even becomes distinct as compared with the sensitivities other than at the specific frequency in the vicinity of the specific frequency.

Figure 10:
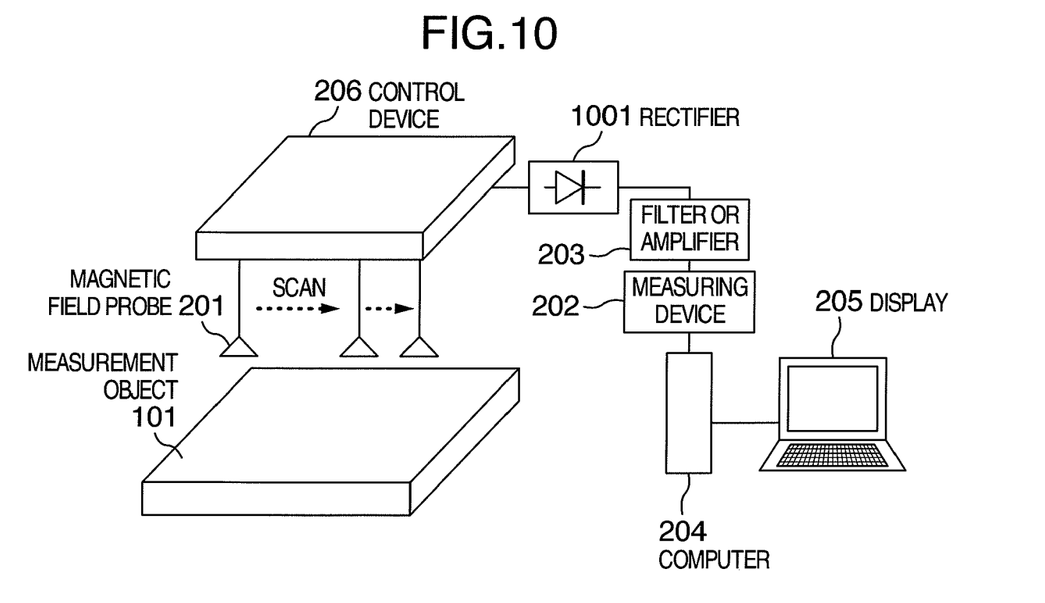
FIG. 10 is a general view of another measuring apparatus according to this invention.

As shown in FIG. 10, such a system as a semiconductor inspecting apparatus or a magnetic field measuring apparatus, incorporating therein a magnetic field probe according to this invention, may be provided with a diode or a rectifier 1001 between the feeder lines and the measuring device or in the measuring device. Then the voltage or current detected by the magnetic field probe can be rectified to give rise to a DC voltage representative of the magnetic field intensity being measured. In this measurement, the obtained value of the voltage or current is that of the voltage dominantly induced at the series resonance frequency and therefore the value associated with the required magnetic field intensity can be obtained. Any type of diode or rectifier can be used in this case. For example, the diode or rectifier 1001 can be formed on the substrate where the loop-like conductor is disposed, by the conventional integrated circuit technique.

Figure 11:
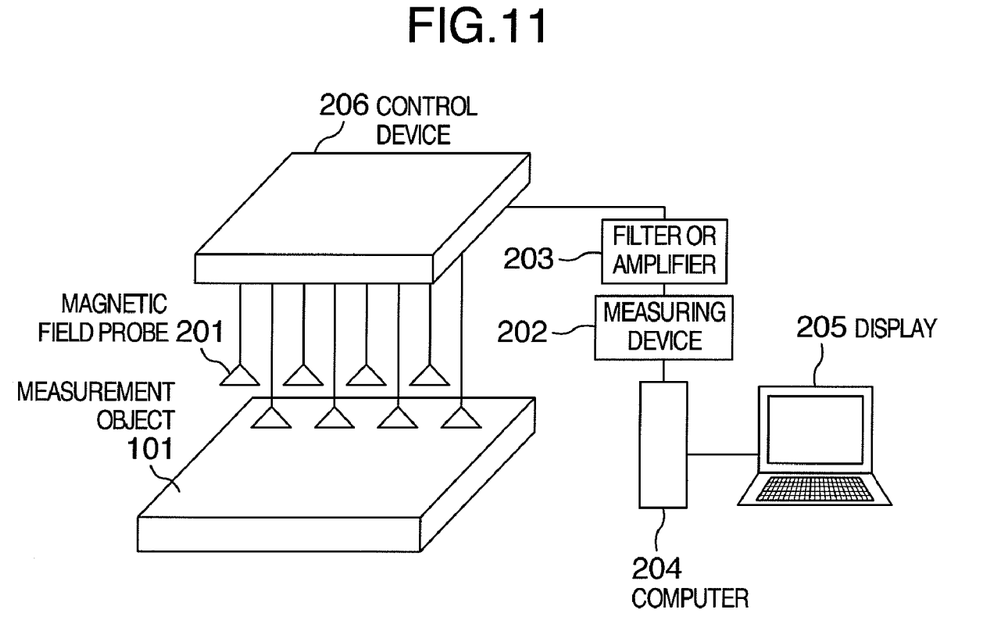
FIG. 11 is a general view of still another measuring apparatus according to this invention.

In the foregoing description, a single probe scans the vicinity of the measurement object 101 and the measurement is made of the voltage induced due to the presence of magnetic field. Alternatively, as shown in FIG. 11, a sensor array is built with a plurality of magnetic field probes 201 arranged in the form of an array; the voltages induced at the plural probes (or sensors) are subjected to a parallel processing; and the spatial distribution of the intensity, phase, orientation of magnetic field being measured can be evaluated. Further, if the plural magnetic field probes are given different series resonance frequencies, magnetic field measurement with high sensitivity can be realized over a wide range of frequencies.

As described above, according to this invention, the magnetic field generated by any type of electronic appliance can be measured with high sensitivity at a required frequency.

This invention can be used to evaluate the magnetic field generated by the wiring conductors used in the printed circuit boards PCBs, semiconductor devices such as integrated circuits representative of large scale integrated circuits LSIs, modules incorporating therein such semiconductor devices, and other electric and electronic products. When this invention is applied to techniques to inspect electronic devices used in communication apparatuses, computers or display devices which treat electric signals having specific frequencies, the weak electromagnetic radiation attributable to the electric signals handled by the electronic devices can be measured with high sensitivity from outside of the electronic devices. Accordingly, by evaluating with a magnetic field probe according to this invention the unwanted electromagnetic radiation generated from electronic devices, the quality of the electronic devices can be securely controlled and also the development and design of new electronic devices free from electromagnetic interference (referred to also as EMI) can be accelerated on the basis of the result of such evaluations.

This invention may be embodied in other specific forms without departing from the spirit or essential characteristics thereof. The above described embodiment is therefore to be considered in all respect as illustrative and not restrictive, the scope of this invention being indicated by the appended claims rather than by the foregoing description and all changes which come within the meaning and range of equivalency of the claims are therefore intended to be embraced therein.

The invention claimed is:

1. A magnetic field probe apparatus comprising a probe element for detecting the magnetic field generated by a measurement object; at least a pair of transmission lines connected with each other via a load element across which a voltage is developed or in which a current is induced, in response to the detection of the magnetic field by means of the probe element; and a control device for controlling the position of the probe element with respect to the measurement object; wherein the probe element includes at least one conductor line having both its ends extending in the direction opposite to that direction in which the probe element approaches the measurement object under the control of the control device for measurement; and at least one end of the one conductor line is disposed opposite to and separated at a distance from, one of the transmission lines in an area remote from the measuring portion of the probe element so that electric capacitance may be formed between the one end of the one conductor line and the one of the transmission lines.

2. A magnetic field probe apparatus as claimed in claim 1, wherein the probe element is in a multilayer configuration comprising a plurality of substrates including a first substrate with the transmission lines formed thereon and a second substrate with the conductor line formed thereon, and the value of the electric capacitance is adjusted by adjusting the area of that part of one of the transmission line which faces the conductor line with at least one of the substrates interposed in between, or by adjusting the thickness of the one substrate interposed in between.

3. A magnetic field probe apparatus as claimed in claim 1, wherein the probe element comprises a substrate having a main surface on which the transmission lines and the conductor line are formed, and the value of the electric capacitance is adjusted by modifying the shapes of the one end of the conductor line and the opposing end of the one of the transmission lines or by changing the distance between those ends.

4. A magnetic field probe apparatus as claimed in claim 1, wherein the transmission line which forms the electric capacitance with the one end of the conductor line is connected with the earth potential directly or via the load element.

5. A magnetic field probe apparatus as claimed in claim 1, wherein the other end of the one conductor line is disposed opposite to and separated at a distance from, the other transmission line in an area remote from the measuring portion of the probe element.

6. A magnetic field probe apparatus as claimed in claim 5, wherein one transmission line spaced by a gap from one end of at least one of the conductor lines in the area remote from the measuring portion of the probe element is connected electrically via the load element with the other transmission line spaced by a similar gap from the other end of the one conductor line in the area remote from the measuring portion of the probe element.

7. A magnetic field probe apparatus as claimed in claim 1, wherein the inductance of at least one of the conductor lines included in the probe element can be adjusted by varying the length of that portion of the conductor line lying along the measuring portion of the probe element.

* * * * *